(12) United States Patent
Watanabe

(10) Patent No.: US 9,193,526 B2
(45) Date of Patent: Nov. 24, 2015

(54) COMPONENT SUPPLYING APPARATUS

(71) Applicant: PANASONIC INTELLECTUAL PROPERTY MANAGEMENT CO., LTD., Osaka (JP)

(72) Inventor: Hideaki Watanabe, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/681,473

(22) Filed: Apr. 8, 2015

(65) Prior Publication Data

US 2015/0291358 A1 Oct. 15, 2015

(30) Foreign Application Priority Data

Apr. 10, 2014 (JP) .................................. 2014-080841

(51) Int. Cl.
*B65G 11/02* (2006.01)
*H05K 13/02* (2006.01)

(52) U.S. Cl.
CPC .................................. *B65G 11/023* (2013.01)

(58) Field of Classification Search
CPC ..... B65G 11/023; B65G 11/183; H05K 13/02
USPC .......... 198/535, 550.2, 861.1; 193/1, 2 R, 15, 193/16, 17, 25 C, 30, 2 C, 40
See application file for complete search history.

(56) References Cited

U.S. PATENT DOCUMENTS

| 4,201,313 | A | * | 5/1980 | Kirsch | ........................ | 221/171 |
| 4,360,095 | A | * | 11/1982 | Baldwin et al. | ................. | 193/40 |
| 4,466,229 | A | * | 8/1984 | Gino | .............................. | 53/559 |
| 4,744,451 | A | * | 5/1988 | Sekiguchi et al. | ............. | 193/40 |
| 4,860,922 | A | * | 8/1989 | Malservisi et al. | ............... | 221/6 |
| 4,913,315 | A | * | 4/1990 | Wagner | ......................... | 221/200 |
| 4,981,204 | A | * | 1/1991 | Smith | ........................... | 198/313 |
| 6,293,389 | B1 | * | 9/2001 | Knapp et al. | .................. | 198/823 |
| 7,412,815 | B2 | * | 8/2008 | Schmetzer | ...................... | 53/589 |
| 8,701,894 | B2 | * | 4/2014 | Carter | .......................... | 209/242 |

FOREIGN PATENT DOCUMENTS

JP           2-271699 A        11/1990

* cited by examiner

*Primary Examiner* — Douglas Hess
(74) *Attorney, Agent, or Firm* — Pearne & Gordon LLP

(57) ABSTRACT

A component supplying apparatus includes a chute section including a sliding surface on which an electronic component is slidable. The chute section includes: a pair of bottom support members which oppose each other in a lateral direction perpendicular to a sliding direction such that a distance between the bottom support members is changeable, and each of which includes an upper surface defining the sliding surface; a pair of side support members which oppose each other in the lateral direction such that a distance between the side support members is changeable, and which support lateral side surfaces of the electronic component sliding on the sliding surface; and a top support member which opposes the sliding surface such that a distance between the top support member and the sliding surface is changeable, and which prevents the electronic component sliding on the sliding surface from escaping upward.

3 Claims, 7 Drawing Sheets

COMPONENT SUPPLYING APPARATUS

BACKGROUND

1. Technical Field

One or more aspects of the present invention relate to a component supplying apparatus including a chute section which includes a sliding surface on which an electronic component delivered from a component delivering section is slidable.

2. Background Art

As a component supplying apparatus which supplies an electronic component such as a connector or a component with lead to a component pickup position of a component mounting apparatus, there is an apparatus including a chute section which moves an electronic component while causing the electronic component to slide on a sliding surface (for example, see JP-A-H02-271699). The chute section includes, in a cross-sectional view, a sliding surface on which an electronic component is slidable; a pair of side support surfaces which support lateral side surfaces of the electronic component sliding on the sliding surface; and a top support surface which prevents the electronic component sliding on the sliding surface from escaping upward. The chute section allows an electronic component to be surely conveyed in a stabilized posture to a predetermined position.

SUMMARY

In order to enable an electronic component to smoothly slide in a stabilized posture in the chute section, the sliding surface, the side support surfaces, and it is necessary to adequately arrange the top support surface of the chute section in accordance with the shape (the shape as viewed in the sliding direction) of the electronic component. Therefore, it is necessary to provide a chute section dedicated for each shape of an electronic component, which causes increase of production cost.

An object of one or more aspects of the invention is to provide a component supplying apparatus which can be used for various kinds of electronic components.

One or more aspects of the invention provide a component supplying apparatus including: a chute section including a sliding surface on which an electronic component delivered from a component delivering section is slidable in a sliding direction, wherein the chute section includes: a pair of bottom support members which oppose each other in a lateral direction perpendicular to the sliding direction such that a first distance between the bottom support members is changeable, and each of which includes an upper surface defining the sliding surface; a pair of side support members which oppose each other in the lateral direction such that a second distance between the side support members is changeable, and which support lateral side surfaces of the electronic component sliding on the sliding surface; and a top support member which opposes the sliding surface such that a third distance between the top support member and the sliding surface is changeable, and which prevents the electronic component sliding on the sliding surface from escaping upward.

According to one or more aspects of the invention, it possible to provide a component supplying apparatus which can be used for various kinds of electronic components.

DETAILED DESCRIPTION

Figure 1:
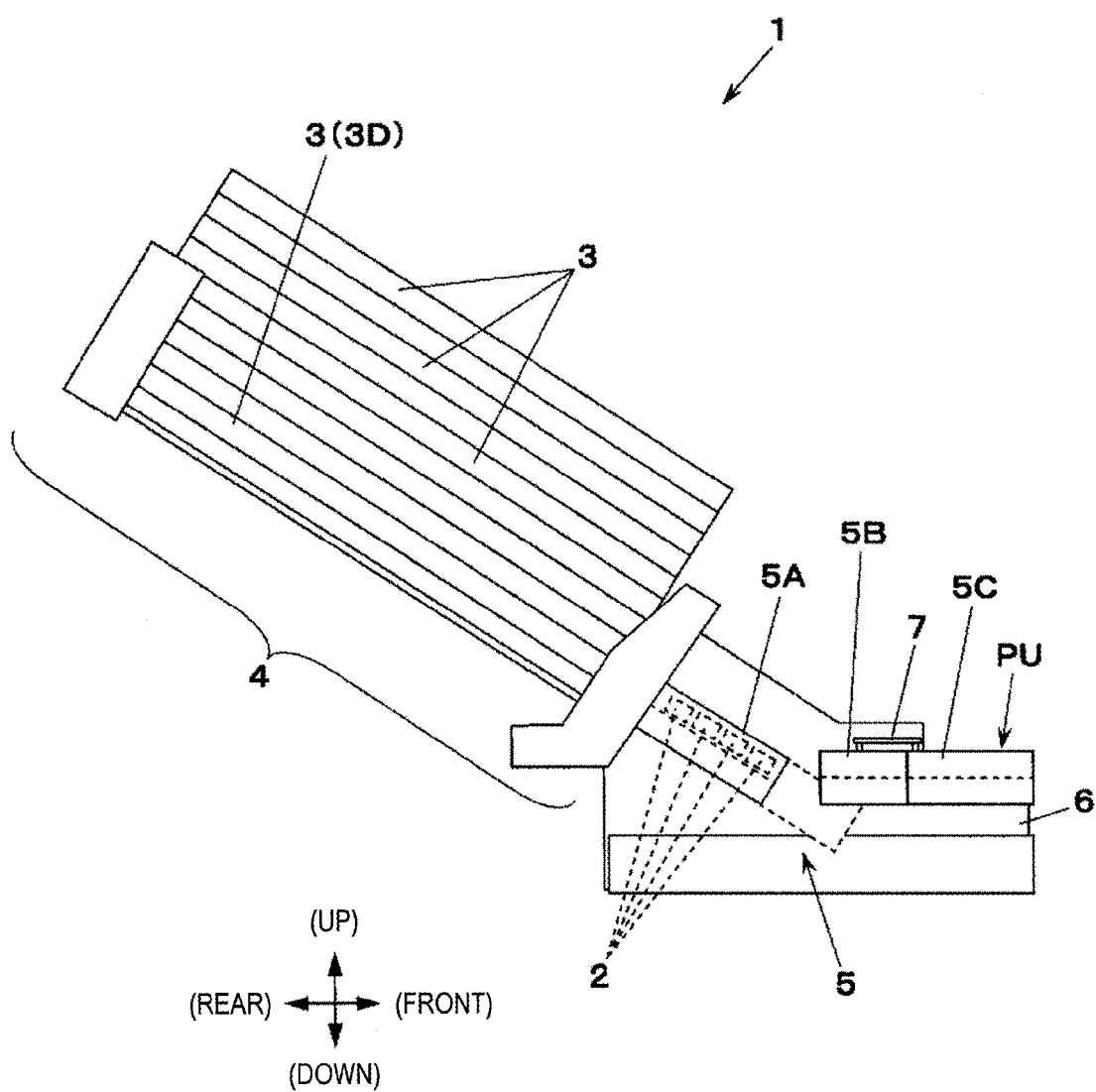
FIG. 1 is a side view of a component supplying apparatus of an embodiment of the invention.
Figure 2A:
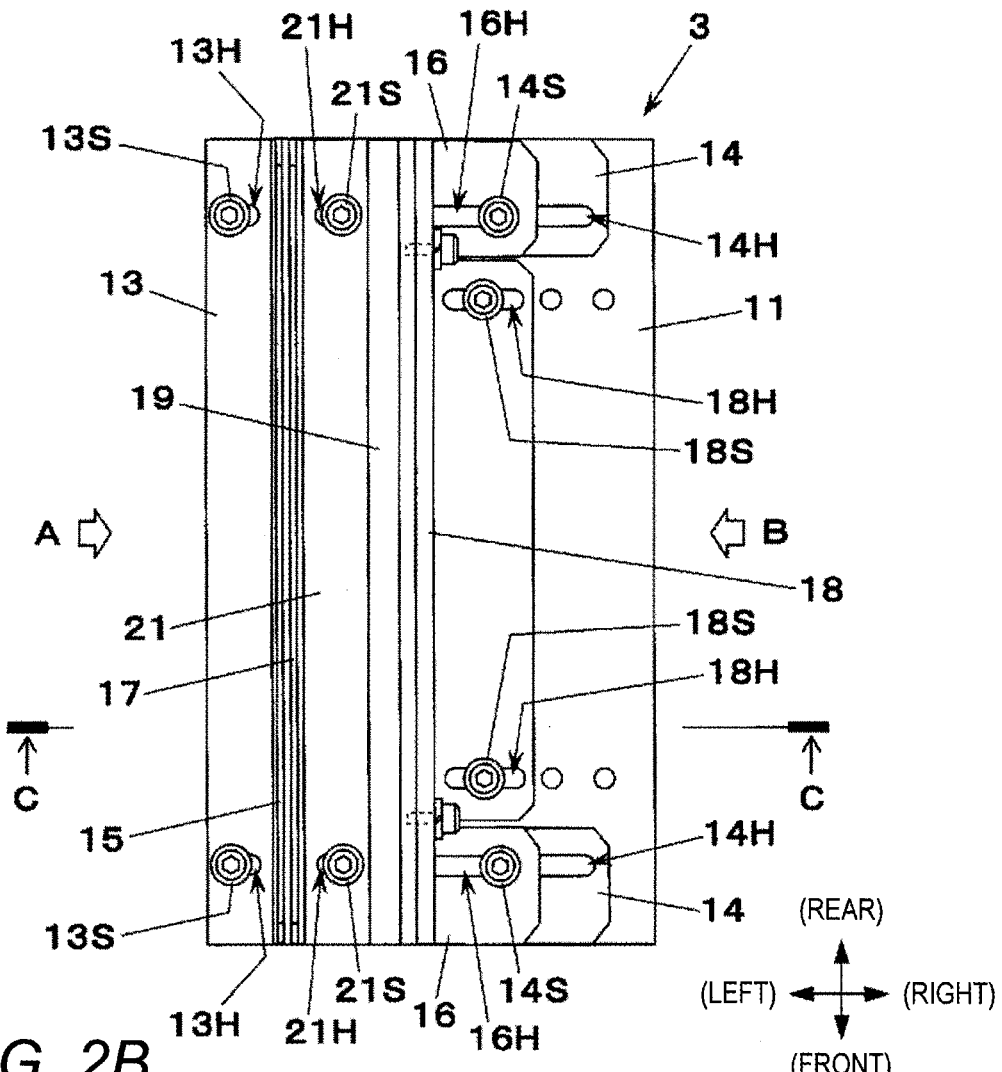
FIG. 2A is a plan view of a chute section of the component supplying apparatus of the embodiment of the invention.
Figure 2B:
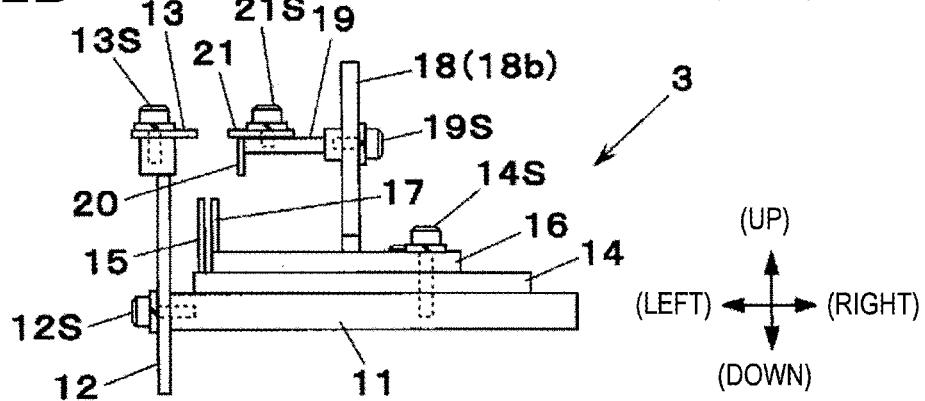
FIG. 2B is a front view of the chute section.

Hereinafter, an embodiment of the invention will be described with reference to the drawings. FIGS. 1, 2A, and 2B show a component supplying apparatus 1 of the embodiment of the invention. The component supplying apparatus 1 serves as an example of a component supplying unit which is provided in a component mounting apparatus for mounting the electronic component 2 on a circuit board and which supplies the electronic component 2 to a predetermined position.

The component supplying apparatus 1 includes: a stick holding section 4 which holds sticks 3 (component delivering section) storing electronic components 2; and a chute section 5 which conveys the electronic component 2 supplied from the sticks 3. The stick holding section 4 is mounted on the chute section 5. The stick holding section 4 holds a plurality of cylindrical sticks 3 each storing a plurality of electronic components 2. The plurality of sticks 3 are held in an inclined posture and in a stacked state in which the sticks 3 are vertically stacked. In the stick holding section 4, the electronic components 2 stored in the lowermost stick 3 (in FIG. 1, indicated by the reference numeral 3D) are supplied by using the own weight of the electronic component 2 to an inclined chute 5A which will be described later. When the lowermost stick 3 becomes empty, the stick holding section 4 causes the lowermost stick to be dropped and discharged, moves the next lowermost stick 3 to the lowermost stage, and continues the supply of the electronic component 2.

The chute section 5 includes three chutes which are placed on a basal section 6 which is mounted on the component mounting apparatus (not shown). In the embodiment, the inclined chute 5A, a movable chute 5B, and a horizontal chute 5C correspond to the three chutes, respectively. The inclined chute 5A is placed at the same inclination as the sticks 3 held by the stick holding section 4, and an upper portion of the inclined chute 5A is positioned on the extension line of the lowermost stick 3. The inclined chute 5A receives and stocks the electronic component 2 sliding down from the lowermost stick 3. The horizontal chute 5C is disposed in a horizontal posture, and the front end (the right end of the sheet of FIG. 1) of the horizontal chute 5C is formed as a component pickup section PU where the electronic component 2 is delivered to the component mounting apparatus. While changing the posture, the movable chute 5B is moved between a position where the chute is coupled to a lower portion of the inclined chute 5A, and a position where the chute is coupled to the rear end of the horizontal chute 5C. The movable chute 5B is coupled in an inclined posture to the inclined chute 5A to receive one electronic component 2. Then, the movable chute 5B which has received the electronic component 2 changes the posture to a horizontal posture, and is coupled to the rear end of the horizontal chute 5C. A component feed pawl 7 is disposed in the vicinity of the rear end of the horizontal chute 5C. The component feed pawl 7 conveys the electronic component 2 in the movable chute 5B coupled to the horizontal chute 5C, to the component pickup section PU.

In the inclined chute 5A, the movable chute 5B, and the horizontal chute 5C, their conveying paths (component paths) for the electronic component 2 are substantially common in structure. Hereinafter, the configuration of the chute section 5 will be described by using the movable chute 5B as a typical example. The movable chute 5B includes a stopper for the electronic component 2, a sensor for detecting the electronic component 2, and the like. However, members which are not necessary in the description of the conveying path (component path) are not shown or described in the drawings and the specification.

FIG. 2A is a plan view of the movable chute 5B in which the component path is illustrated directed in the vertical direction in the sheet, and FIG. 2B is a front view of the movable chute 5B. Referring to FIGS. 2A and 2B, the movable chute 5B has a base portion 11 in which the upper surface is flat, and a left side support 12 is disposed in the left end of the base portion 11. The right side surface of an upper portion of the left side support 12 defines a left side support surface 12F. A left top support 13 is attached to the upper surface of the left side support 12. The lower surface of a portion which extends to the right side of the left top support 13 defines a left top support surface 13F. A left bottom support base 14 is disposed so as to laterally extend, on the upper surface of the base portion 11. A left bottom support 15 configured by a plate-like member is erected on the left end of the left bottom support base 14. The upper surface of the left bottom support 15 defines a left sliding surface 15F.

Figure 3A:
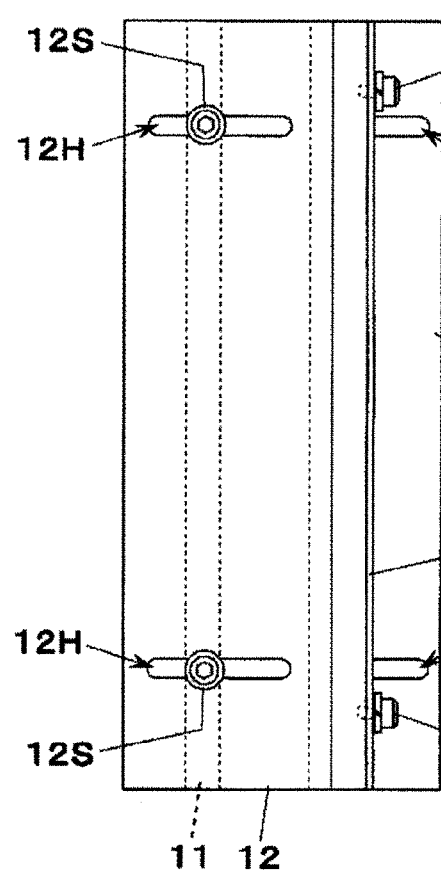
FIGS. 3A and 3B are side views of the chute section in the embodiment of the invention.
Figure 3A:
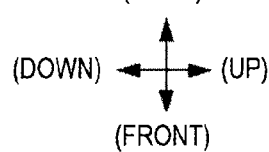
Figure 3B:
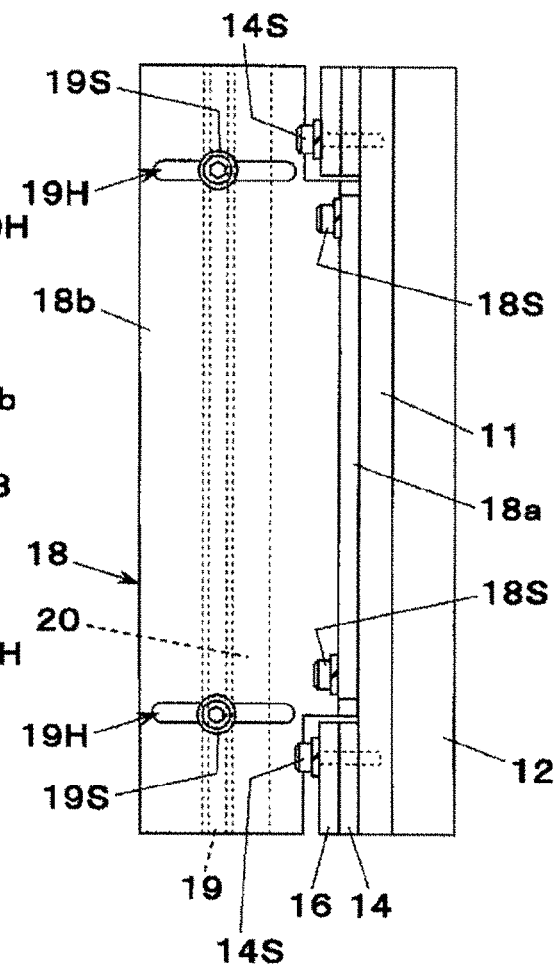
Figure 3B:
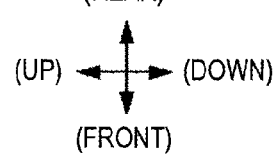

FIG. 3A is a side view as seen from the arrow A in FIG. 2A, and FIG. 3B is a side view as seen from the arrow B in FIG. 2A. Referring to FIGS. 2A, 2B, 3A, and 3B, a right bottom support base 16 is disposed so as to laterally extend, on the upper surface of the left bottom support base 14. A right bottom support 17 configured by a plate-like member is erected on the left end of the right bottom support base 16. The upper surface of the right bottom support 17 defines a right sliding surface 17F. The right sliding surface 17F is substantially flush with the left sliding surface 15F in the vertical direction. As described above, the left bottom support 15 and the right bottom support 17 are arranged in parallel to extend along the sliding direction of the electronic component 2. The dimensions of the plate-like members constituting the left bottom support 15 and the right bottom support 17 are determined in consideration of the maximum length of leads of the electronic component 2 to be supplied. The width dimension is set so that, even when the left bottom support 15 and the right bottom support 17 support the lower surface of the electronic component 2, the leads do not interfere with the left bottom support base 14 and the right bottom support base 16. The thicknesses (the width dimension of the sliding surface) of the plate-like members are determined considering the minimum pitch of the leads of the electronic component 2 to be supplied in the width direction.

Figure 4A:
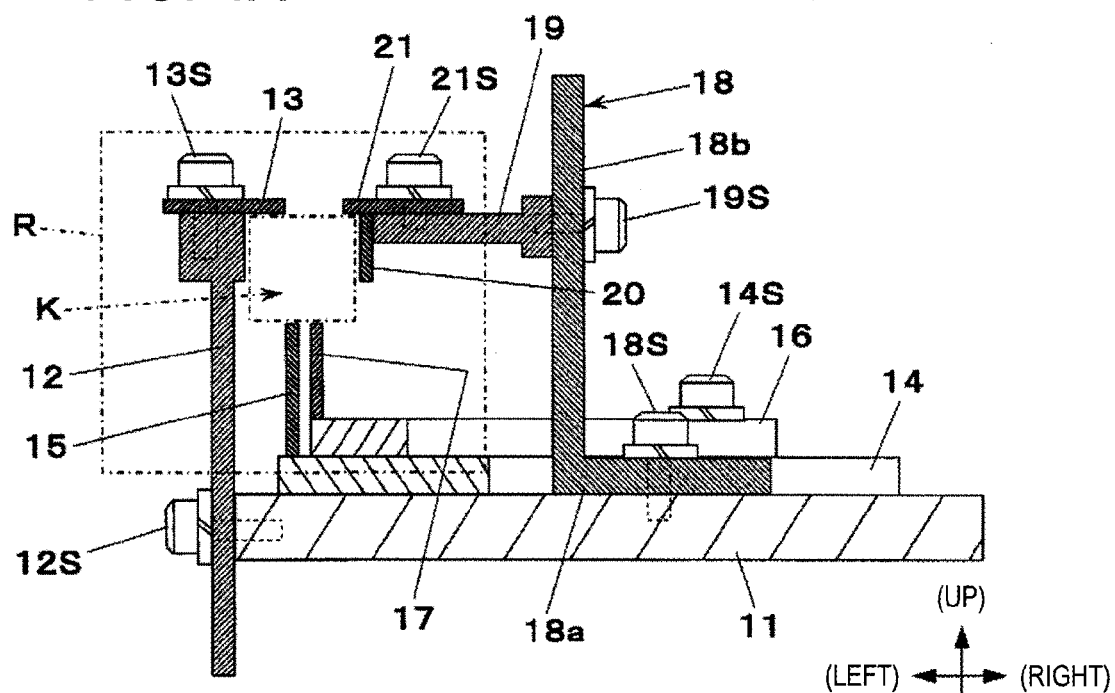
FIGS. 4A and 4B are cross-sectional views of the chute section in the embodiment of the invention.
Figure 4B:
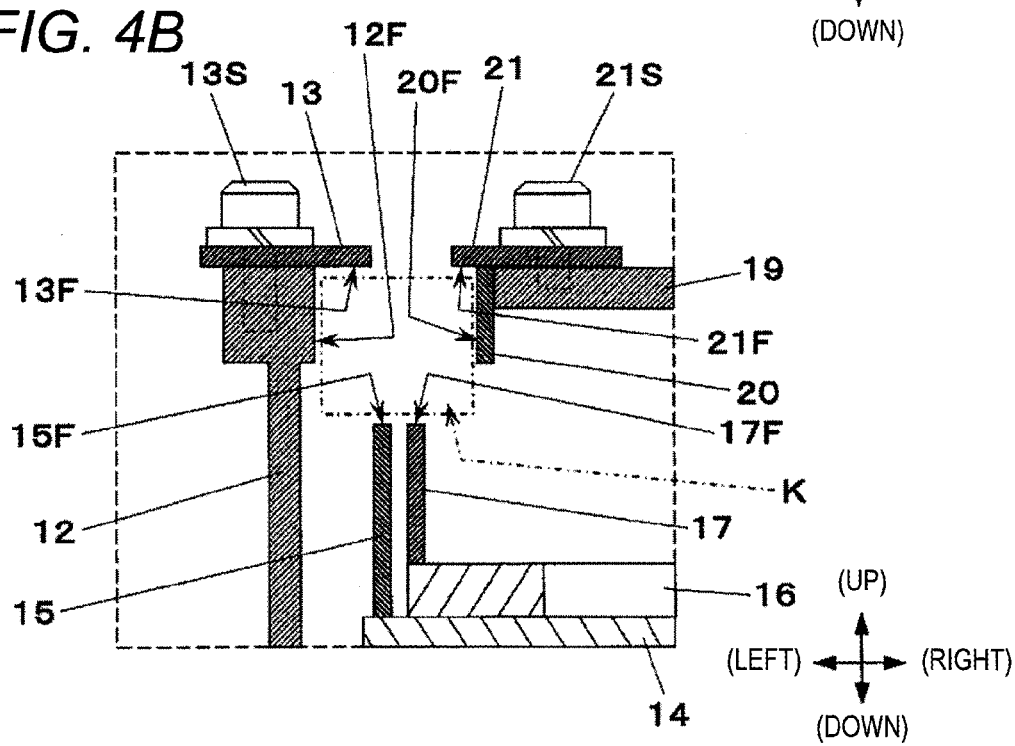

FIG. 4A is a cross-sectional view as seen from the arrows C in FIG. 2A, and FIG. 4B is an enlarged view of the region R in FIG. 4A. Referring to FIGS. 2A, 2B, 3A, 3B, and 4A, a right base 18 is attached to the upper surface of the base portion 11. The right base 18 includes a horizontal sliding portion 18a and a supporting portion 18b which extends upward and perpendicularly to the sliding portion 18a. A right side support base 19 is attached to the left side surface of the supporting portion 18b of the right base 18. A right side support 20 is disposed on the right side support base 19. The left side surface of the right side support 20 is a right side support surface 20F. A right top support 21 is disposed on the upper surface of the right side support base 19. The lower surface of a portion which extends to the left side of the right top support 21 is a right top support surface 21F.

Referring to FIGS. 2A to 4B, long holes 12H which vertically extend are formed in the left side support 12. Fixing screws 12S which are screwed into the left end of the base portion 11 are passed through the long holes 12H, respectively. When the fixing screws 12S are tightened, the left side support 12 is fixed to the base portion 11. The vertical position of the left side support surface 12F is adjusted by vertically sliding the left side support 12 in the state where the fixing screws 12S are loosened.

Long holes 13H which laterally extend are formed in the left top support 13. Fixing screws 13S which are screwed into the upper surface of the left side support 12 are passed through the long holes 13H, respectively. When the fixing screws 13S are tightened, the left top support 13 is fixed to the left side support 12. The protruding length of the left top support surface 13F from the left side support 12 is adjusted by laterally sliding the left top support 13 in the state where the fixing screws 13S are loosened.

Long holes 14H which laterally extend are formed in the left bottom support base 14. In the right bottom support base 16, long holes 16H which laterally extend are formed at positions respectively overlapping the long holes 14H. Fixing screws 14S screwed into the upper surface of the base portion 11 are passed through the long holes 14H of the left bottom support base 14 and the long holes 16H of the right bottom support base 16, respectively. When the fixing screws 14S are tightened, the left bottom support base 14 and the right bottom support base 16 are fixed to the base portion 11. The lateral positions of the left bottom support 15 and the right bottom support 17 are adjusted by laterally sliding the left bottom support base 14 and the right bottom support base 16 in the state where the fixing screws 14S are loosened, respectively. As described above, the left bottom support 15 and the right bottom support 17 are disposed on the left bottom support base 14 and right bottom support base 16 serving as an example of sliding members movable in the lateral direction (i.e., the lateral positions of the sliding members are changeable), respectively. Accordingly, the distance between the bottom support bases 14, 16 can be freely changed is attained.

Long holes 18H which laterally extend are formed in the sliding portion 18a of the right base 18. Fixing screws 18S which are screwed into the upper surface of the base portion 11 are passed through the long holes 18H, respectively. When the fixing screws 18S are tightened, the right base 18 is fixed to the base portion 11. The lateral position of the right side support surface 20F is adjusted by laterally sliding the right base 18 in the state where the fixing screws 18S are loosened.

Long holes 19H which vertically extend are formed in the supporting portion 18b of the right base 18. Fixing screws 19S which are screwed into the right end surface of the right side support base 19 are passed through the long holes 19H, respectively. When the fixing screws 19S are tightened, the right side support base 19 is fixed to the right base 18. The vertical position of the right side support surface 20F is adjusted by vertically sliding the right side support base 19 in the state where the fixing screws 19S are loosened.

Long holes 21H which laterally extend are formed in the right top support 21. Fixing screws 21S which are screwed into the upper surface of the right side support base 19 are passed through the long holes 21H, respectively. When the fixing screws 21S are tightened, the right top support 21 is fixed to the right side support base 19. The protruding length of the right top support surface 21F from the right side support base 19 is adjusted by laterally sliding the right top support 21 in the state where the fixing screws 21S are loosened.

Figure 5A:
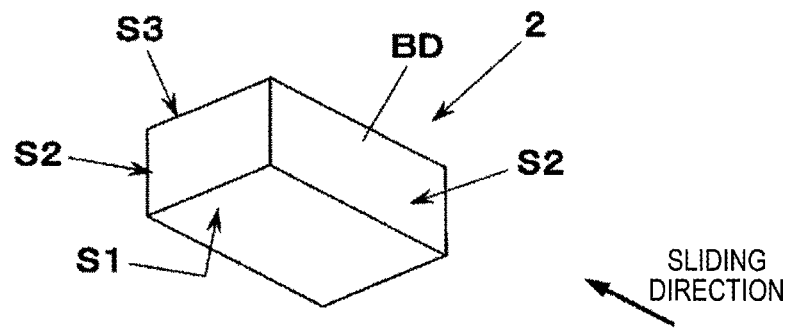
FIGS. 5A to 5D are views illustrating examples of electronic components to be supplied by the component supplying apparatus of the embodiment of the invention.
Figure 5B:
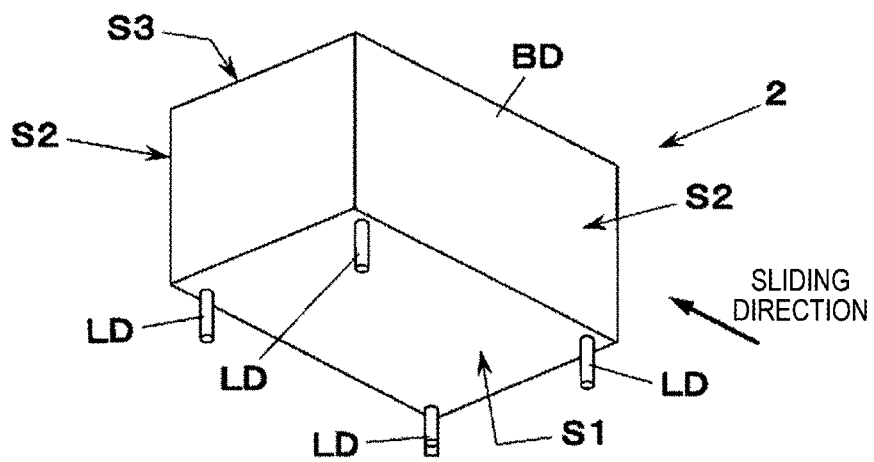
Figure 5C:
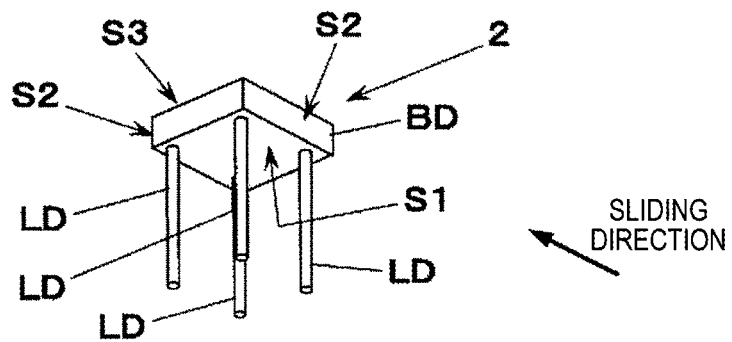
Figure 5D:
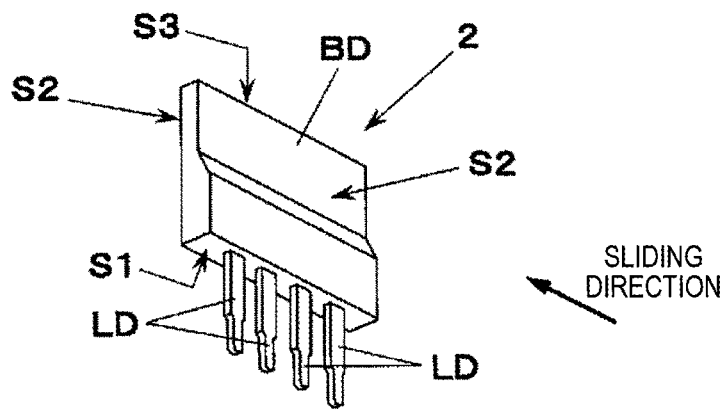

FIGS. 5A to 5D show examples of the electronic component 2 which is to be supplied by the component supplying apparatus 1. The electronic component 2 of FIG. 5A is an electronic component which is configured by a rectangular parallelepiped body portion BD, and which has no lead. The electronic component 2 in FIG. 5B is a electronic component with lead which includes a rectangular parallelepiped body portion BD, and four leads LD that downward protrude and extend from the four corners of the lower surface S1 of the body portion BD, respectively. The electronic component 2 in FIG. 5C is a electronic component with lead which includes four leads LD that downward extend from the four corners of the lower surface S1 of a body portion BD having a rectangular plate-like shape, respectively. The electronic component 2 in FIG. 5D is a electronic component with lead in which the dimension in the width direction (lateral direction) perpendicular to the sliding direction is small, and which includes four leads LD that are arranged in one row in the sliding direction on the lower surface S1 of a body portion BD. In the electronic component 2, as described above, the shape of the body portion BD, and the protruding manner of the leads LD may be variously changed.

FIGS. 4A and 4B show a space K surrounded by the above-described six surfaces of the movable chute 5B (i.e., the left side support surface 12F, the left top support surface 13F, the left sliding surface 15F, the right sliding surface 17F, the right side support surface 20F, and the right top support surface 21F). The space K functions as the component path through which the electronic component 2 delivered from the stick 3 held in the stick holding section 4 is to be passed. Namely, the left side support 12, the left top support 13, the left bottom support base 14, the left bottom support 15, the right bottom support 17, the right side support 20, and the right top support 21 are support members forming the component path.

Here, the left sliding surface 15F and the right sliding surface 17F define a sliding surface which contacts the lower surface S1 of the body portion BD of the electronic component 2, and which allows the electronic component 2 to slide thereon. The left side support surface 12F and the right side support surface 20F define side support surfaces which support the lateral side surfaces S2 (FIGS. 5A to 5D) of the body portion BD of the electronic component 2 that slides on the sliding surface, respectively. The left top support surface 13F and the right top support surface 21F define a top support surface which supports the upper surface S3 (FIGS. 5A to 5D) of the body portion BD of the electronic component 2 in order to prevent the electronic component 2 sliding on the sliding surface from escaping upward.

The left bottom support 15 and the right bottom support 17 serve as an example of a pair of bottom support members which oppose each other in the lateral direction perpendicular to the sliding direction of the electronic component 2 such that the distance between the bottom support members (first distance) is changeable, and each of which includes the upper surface defining the sliding surface (the left sliding surface 15F and the right sliding surface 17F) for the electronic component 2. The left side support 12 and the right side support 20 serve as an example of a pair of side support members which oppose each other in the lateral direction such that the distance between the side support members (second distance) is changeable, and which support the lateral side surfaces of the electronic component 2 sliding on the sliding surface. The left top support 13 and the right top support 21 serve as an example of a top support member which opposes the sliding surface such that the distance between the top support member and the sliding surface (third distance) is changeable, and which prevents the electronic component 2 sliding on the sliding surface from escaping upward.

In the component supplying apparatus 1 of the embodiment, the distance between the left sliding surface 15F and the right sliding surface 17F can be adjusted in accordance with the dimension in the width direction (lateral direction) of the body portion BD of the electronic component 2 (in the case where the leads LD downward extend from the body portion BD, moreover, in order to avoid the leads LD). Moreover, the distance between the left side support surface 12F and the right side support surface 20F can be adjusted in accordance with the dimension in the width direction of the body portion BD of the electronic component 2. Furthermore, the distance between the left top support surface 13F and the sliding surface and the distance between the right top support surface 21F and the sliding surface can be adjusted in accordance with the height dimension of the body portion BD of the electronic component 2. Therefore, it is possible to enable the electronic component 2 to smoothly slide in a stabilized posture in the movable chute 5B.

Figure 6A:
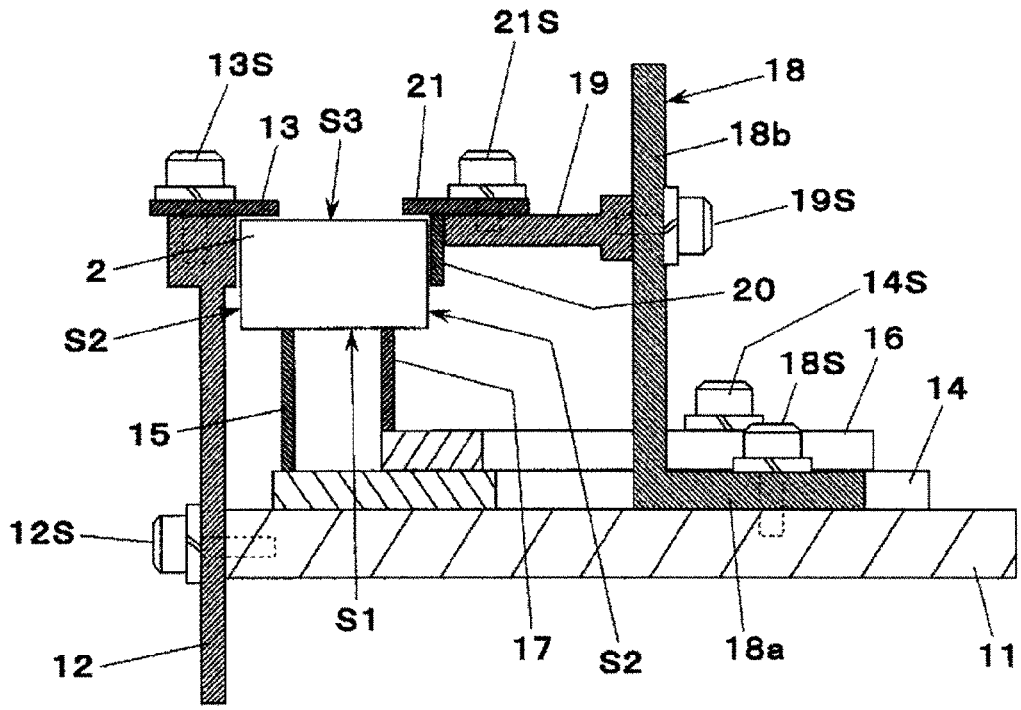
FIGS. 6A and 6B are cross-sectional views of the chute section in the embodiment of the invention.
Figure 6B:
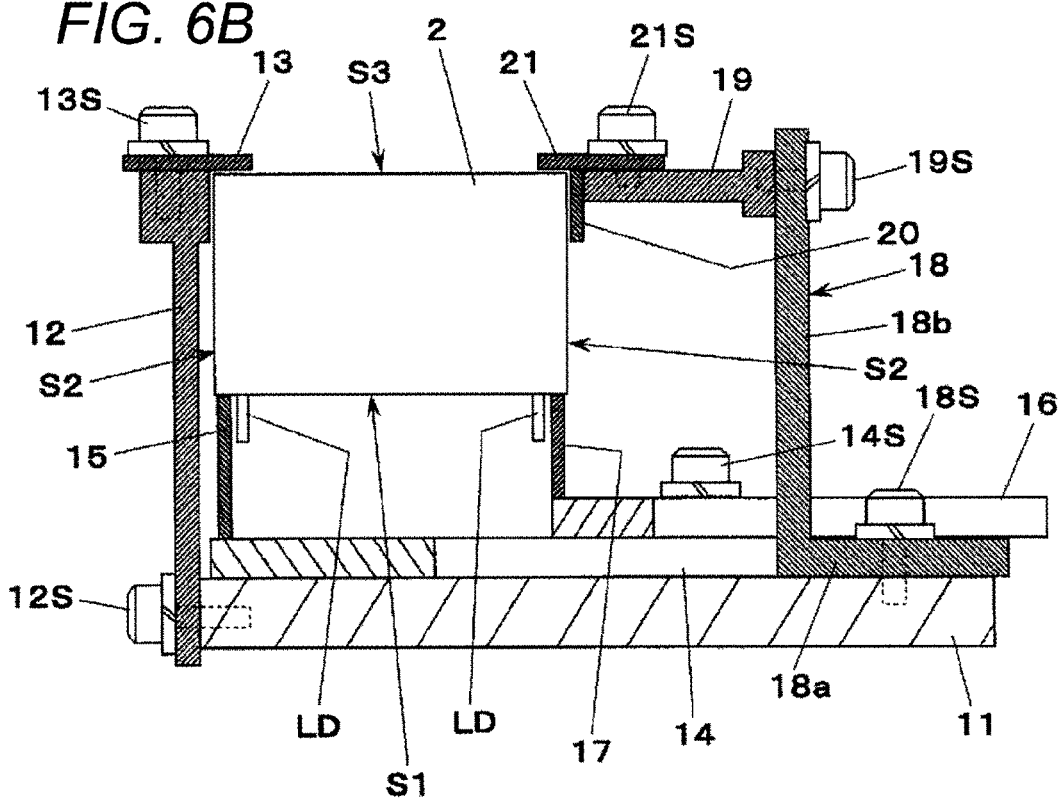
Figure 7A:
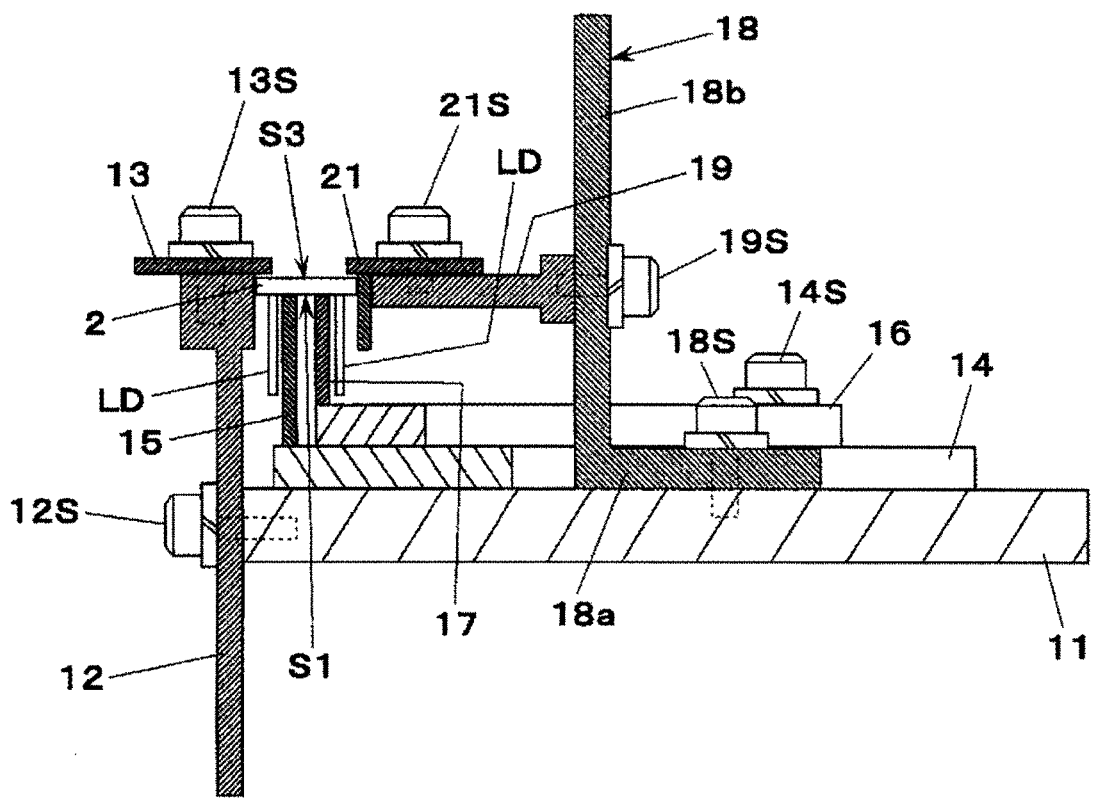
FIGS. 7A and 7B are cross-sectional views of the chute section in the embodiment of the invention.
Figure 7B:
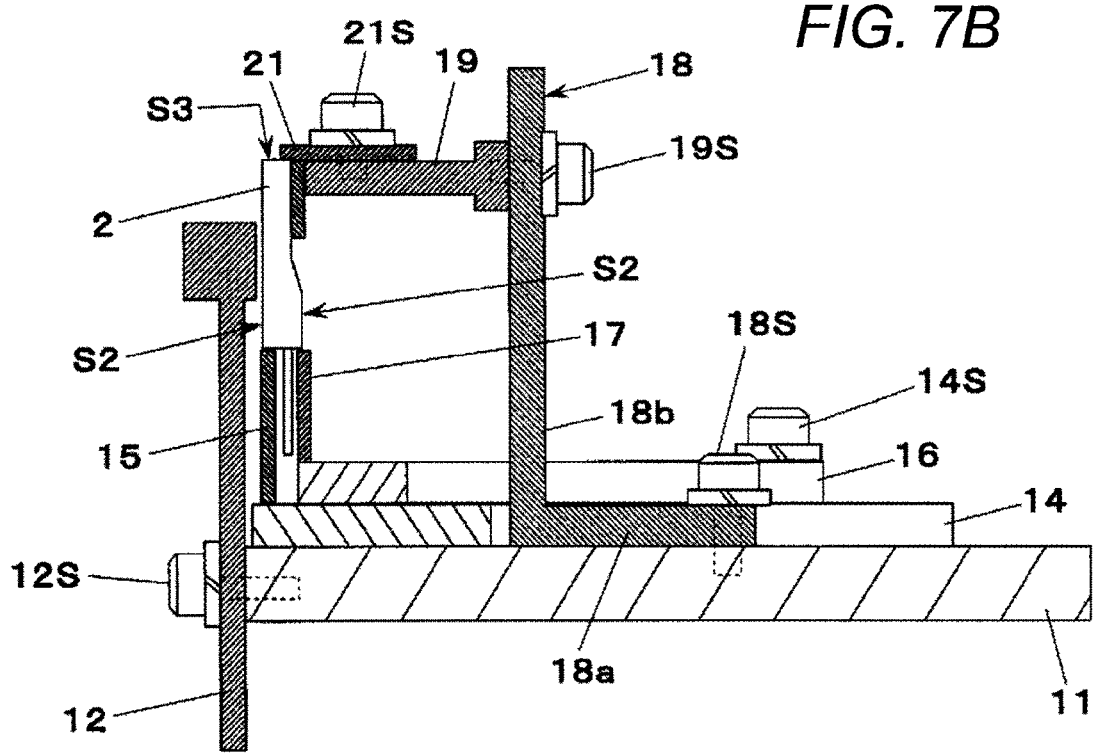

FIGS. 6A, 6B, 7A, and 7B show examples of the adjustment of the movable chute 5B in the case where the electronic component 2 is allowed to smoothly slide in a stabilized posture in accordance with the shape of the component. FIG. 6A shows an example corresponding to the electronic component 2 shown in FIG. 5A. FIG. 6B shows an example corresponding to the electronic component shown in FIG. 5B. FIG. 7A shows an example corresponding to the electronic component 2 shown in FIG. 5C. FIG. 7B shows an example corresponding to the electronic component 2 shown in FIG. 5D. In each case, the two sliding surfaces (the left sliding surface 15F and the right sliding surface 17F) support the lower surfaces S1 of the electronic component 2, and the two side support surfaces (the left side support surface 12F and the right side support surface 20F) support the lateral side surfaces S2 of the electronic component 2 so that the electronic component 2 does not laterally fall over. Moreover, the top support surface (the left top support surface 13F and the right top support surface 21F) supports the upper surface S3 of the electronic component 2 so as to prevent the electronic component 2 from escaping upward. With respect to the electronic components with lead shown in FIGS. 5B and 5C, the two sliding surfaces support the lower surface of the body portion BD without interfering with the leads LD, to allow the electronic component to slide thereon.

FIG. 7B shows the example corresponding to the electronic component 2 shown in FIG. 5D. Also in the case of an electronic component having a small width such as the electronic component 2, the lower surface of the body portion BD can be surely supported by the sliding surfaces of the left bottom support 15 and right bottom support 17 which are configured by the plate-like members, respectively. In the case where the electronic component 2 has a small width, there is a possibility that the left top support 13 and the right top support 21 interfere with each other, and therefore one of the top supports may be removed as required. In FIG. 7B, the left top support 13 is removed, and the upper surface of the electronic component 2 is regulated by only the right top support 21.

When the pair of bottom support members (the left bottom support 15 and the right bottom support 17) are positioned so as to avoid the leads LD of the component with lead, as described above, the component supplying apparatus 1 of the embodiment can be used for various kinds of electronic components with lead. In the component supplying apparatus 1 of the embodiment, the left bottom support 15 and right bottom support 17 which serve as an example of a pair of bottom support members including the plate-like members which are erected on the sliding members (the left bottom support base 14 and the right bottom support base 16) movable in the lateral direction, and which are arranged in parallel to extend along the sliding direction of the electronic component 2. In the configuration where the left bottom support 15 and the right bottom support 17 are configured by the plate-like members, the supports can be easily placed in the interval between the leads LD, and therefore the component supplying apparatus can readily be used for various kinds of electronic components with lead.

In the component supplying apparatus 1 of the embodiment, as described above, the movable chute 5B (i.e., the chute section 5) includes the pair of bottom support members (the left bottom support 15 and the right bottom support 17), the pair of side support members (the left side support 12 and the right side support 20), and the top support member (the left top support 13 and the right top support 21), and has the versatile configuration where the relative positions of the bottom support members, the side support members, and the top support member can be freely changed in accordance with the shape of the electronic component. Therefore, it is not necessary to construct the chute section for each shape of an electronic component, and the production cost can be reduced.

One or more aspects of the invention can be used, for example, in a component supplying apparatus which supplies an electronic component to an automatic assembling apparatus such as a component mounting apparatus.

What is claimed is:

1. A component supplying apparatus comprising:
    a chute section comprising a sliding surface on which an electronic component delivered from a component delivering section is slidable in a sliding direction,
    wherein the chute section comprises:
        a pair of bottom support members which oppose each other in a lateral direction perpendicular to the sliding direction such that a first distance between the bottom support members is changeable, and each of which comprises an upper surface defining the sliding surface;
        a pair of side support members which oppose each other in the lateral direction such that a second distance between the side support members is changeable, and which support lateral side surfaces of the electronic component sliding on the sliding surface; and
        a top support member which opposes the sliding surface such that a third distance between the top support member and the sliding surface is changeable, and which prevents the electronic component sliding on the sliding surface from escaping upward.

2. The component supplying apparatus according to claim 1,
    wherein when the electronic component to be delivered from the component delivering section is an electronic component with lead which comprises a body portion and a lead protruding from a lower surface of the body portion, the first distance is adjustable to allow the lower surface of the body portion to slide on the sliding surface.

3. The component supplying apparatus according to claim 1, further comprising:
    sliding members movable in the lateral direction,
    wherein the pair of bottom support members comprise plate members which are erected on the sliding members, respectively, and which are arranged in parallel to extend along the sliding direction.

* * * * *